(12) United States Patent
Poultney

(10) Patent No.: US 6,867,846 B2
(45) Date of Patent: Mar. 15, 2005

(54) TAILORED REFLECTING DIFFRACTOR FOR EUV LITHOGRAPHIC SYSTEM ABERRATION MEASUREMENT

(75) Inventor: Sherman K. Poultney, Wilton, CT (US)

(73) Assignee: ASML Holding NV (NL)

( * ) Notice: Subject to any disclaimer, the term of this patent is extended or adjusted under 35 U.S.C. 154(b) by 0 days.

(21) Appl. No.: 10/753,557

(22) Filed: Jan. 9, 2004

(65) Prior Publication Data

US 2004/0145714 A1 Jul. 29, 2004

Related U.S. Application Data

(60) Provisional application No. 60/440,051, filed on Jan. 15, 2003.

(51) Int. Cl.[7] .................... G03B 27/52; G03B 27/42; G03B 27/54
(52) U.S. Cl. .................. 355/55; 355/53; 355/67
(58) Field of Search ............ 355/55, 52, 53, 355/67; 356/399–401, 521; 359/35

(56) References Cited

U.S. PATENT DOCUMENTS

| | | | | |
|---|---|---|---|---|
| 4,413,909 A | * | 11/1983 | Pohle | 356/521 |
| 5,333,050 A | * | 7/1994 | Nose et al. | 356/490 |
| 6,360,012 B1 | * | 3/2002 | Kreuzer | 382/211 |
| 6,373,553 B1 | * | 4/2002 | Singh | 355/55 |
| 6,573,997 B1 | * | 6/2003 | Goldberg et al. | 356/521 |
| 6,650,399 B2 | * | 11/2003 | Baselmans et al. | 355/55 |

* cited by examiner

*Primary Examiner*—Henry Hung Nguyen
(74) *Attorney, Agent, or Firm*—Sterne, Kessler, Goldstein & Fox P.L.L.C.

(57) ABSTRACT

A wavefront measurement system includes a source of electromagnetic radiation. An imaging system directs the electromagnetic radiation at an object plane that it uniformly illuminates. A first grating is positioned in the object plane to condition the radiation entering the input of a projection optic. A projection optical system projects an image of the first grating onto the focal plane. A second grating is positioned at the focal plane that receives a diffracted image of the source to form a shearing interferometer. A CCD detector receives the image of the first grating through the projection optical system and the second grating that forms a fringe pattern if there are aberrations in the projection optical system. Phaseshift readout of fringe pattern can be accomplished by stepping the first grating in a lateral direction and reading each frame with the CCD detector. The first grating includes a plurality of reflecting lines each formed by a plurality of reflecting dots. The first grating has a pitch that is ½ times the magnification of the projection system times the pitch of the second grating for achromatic operation.

112 Claims, 14 Drawing Sheets

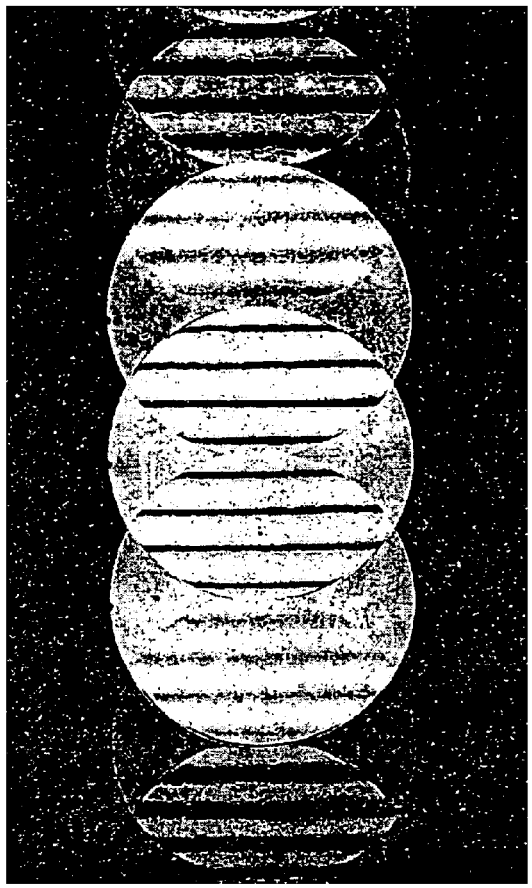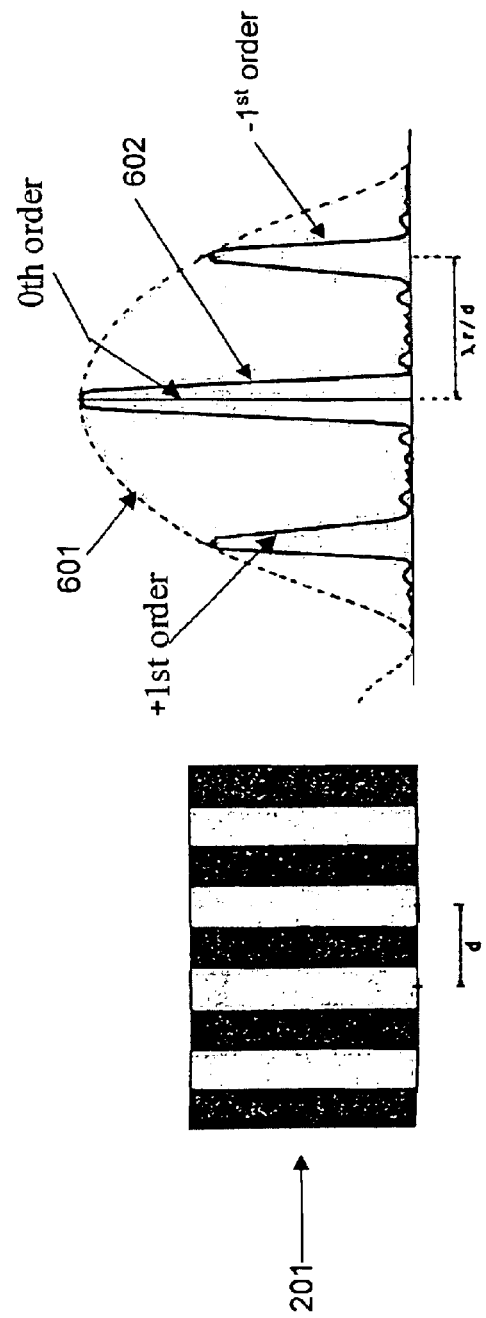
FIG. 6

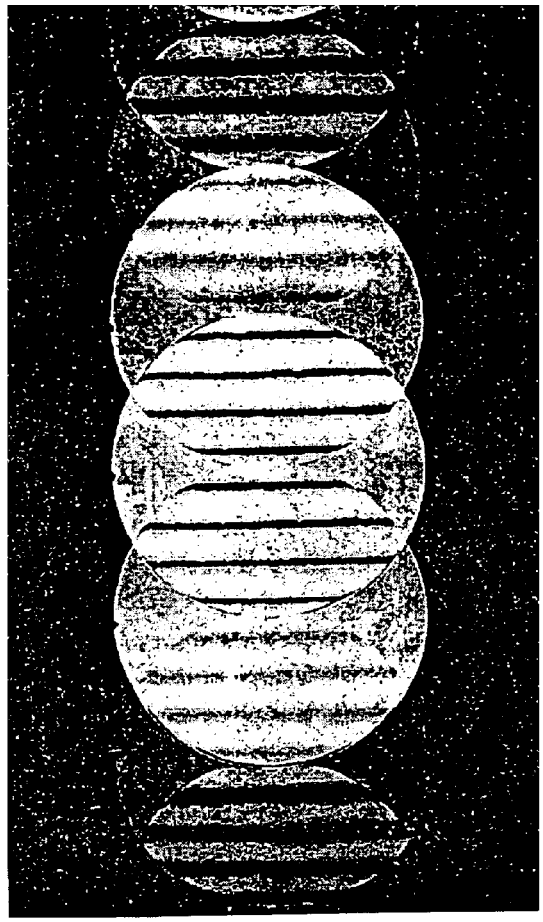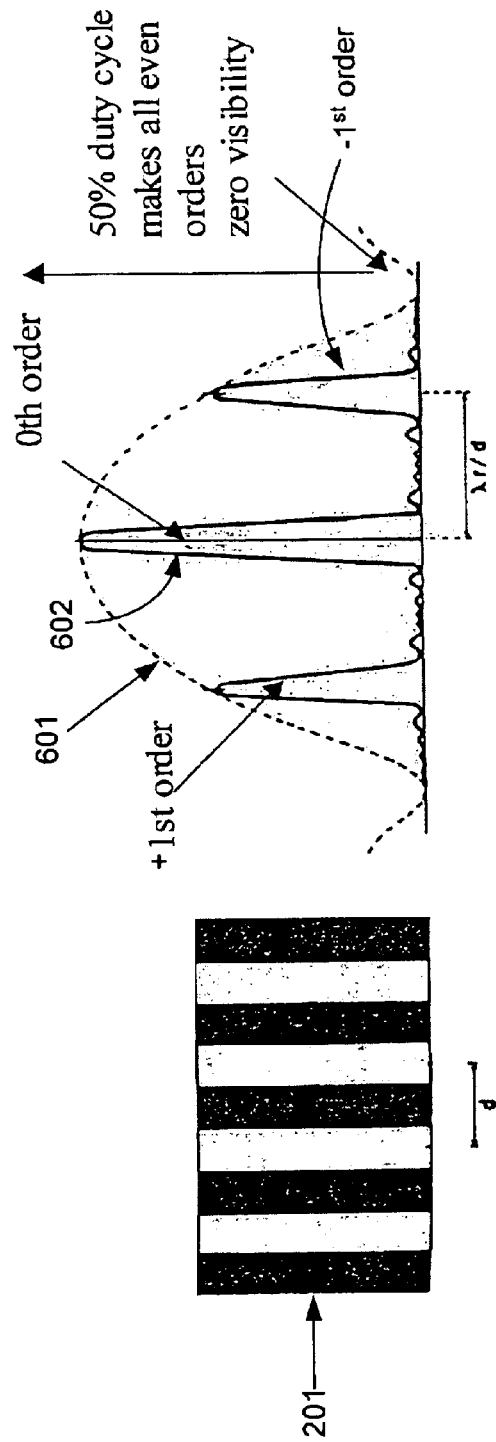
FIG. 7

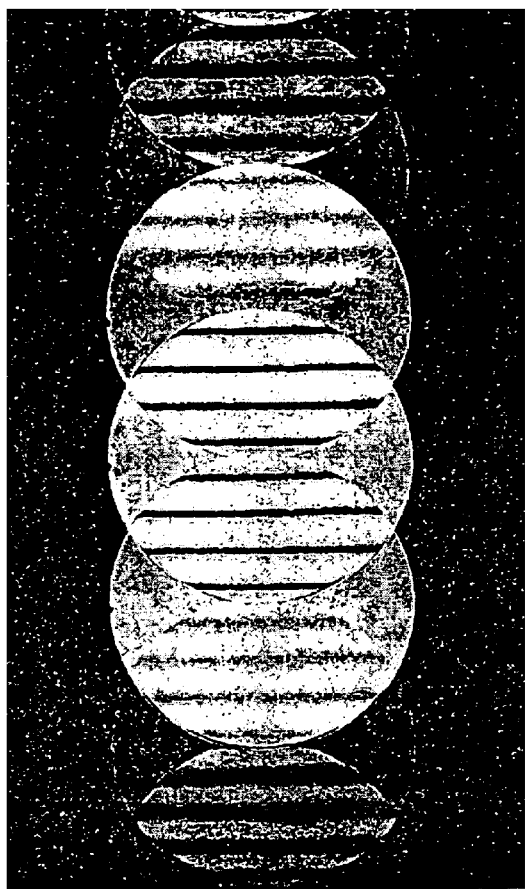
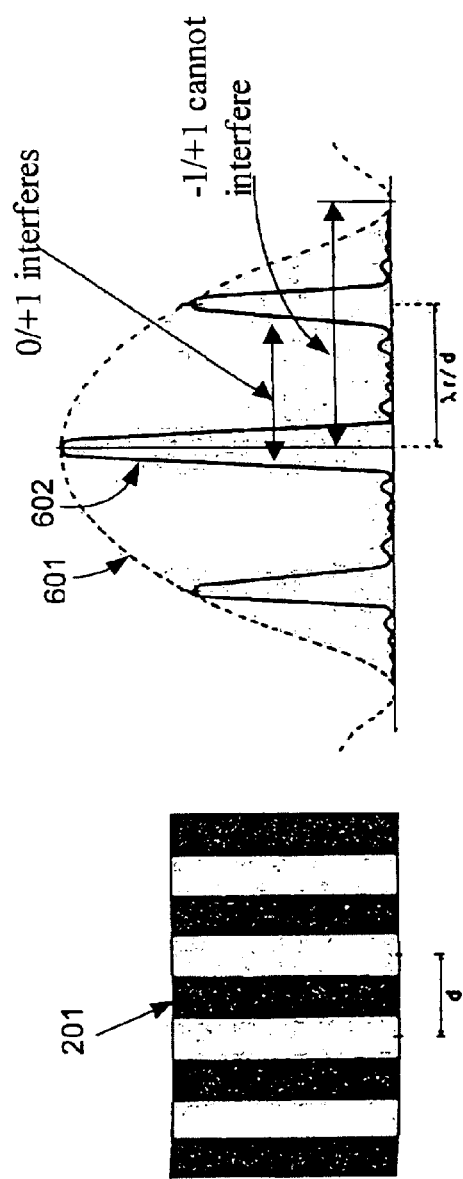
FIG. 8

TAILORED REFLECTING DIFFRACTOR FOR EUV LITHOGRAPHIC SYSTEM ABERRATION MEASUREMENT

CROSS-REFERENCE TO RELATED APPLICATIONS

This application claims priority to U.S. Provisional Patent Application No. 60/440,051, Filed: Jan. 15, 2003, entitled TAILORED REFLECTING DIFFRACTOR FOR EUV LITHOGRAPHIC SYSTEM ABERRATION MEASUREMENT, which is incorporated by reference herein.

BACKGROUND OF THE INVENTION

1. Field of the Invention

The present invention is generally related to extreme ultraviolet (EUV) photolithography systems, and more particularly, to measuring wavefront parameters in a photolithographic system.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage (WS), is exposed to an image projected onto the surface of the wafer by an exposure system located within a lithography system. The exposure system includes a reticle (also called a mask) for projecting the image onto the wafer.

The reticle is generally located between a semiconductor chip and a light source, usually mounted on a reticle stage (RS). In photolithography, the reticle is used as a photo mask for printing a circuit on a semiconductor chip, for example. Lithography light shines through the mask and then through a series of optical lenses that shrink the image. This small image is then projected onto the silicon or semiconductor wafer. The process is similar to how a camera bends light to form an image on film. The light plays an integral role in the lithographic process. For example, in the manufacture of microprocessors (also known as computer chips), the key to creating more powerful microprocessors is the size of the light's wavelength. The shorter the wavelength, the more transistors can be etched onto the silicon wafer. A silicon wafer with many transistors results in a more powerful, faster microprocessor.

As chip manufacturers have been able to use shorter wavelengths of light, they have encountered a problem of the shorter wavelength light becoming absorbed by the glass lenses that are intended to focus the light. Due to the absorption of the shorter wavelength light, the light fails to reach the silicon wafer. As a result, no circuit pattern is created on the silicon wafer. In an attempt to overcome this problem, chip manufacturers developed a lithography process known as Extreme Ultraviolet Lithography (EUVL). In this process, a glass lens can be replaced by a mirror.

The problem of measuring the quality of the illumination beam is a persistent one for the lithographic applications. In particular, it is desirable to be able to measure wavefront quality in the photolithographic tool during wafer production and exposure, rather than having to disassemble the tool in order to do so. The particular environmental needs of an EUV Tool make disassembly a long and arduous task.

SUMMARY OF THE INVENTION

The present invention is directed to a transmission shear grating and checkerboard configuration for EUV wavefront sensor that substantially obviates one or more of the problems and disadvantages of the related art. The present invention is also directed to improving the performance of a shearing interferometer used as an EUV wavefront sensor (WFS) so as to condition the illumination in the object plane as described and to make the WFS achromatic.

An embodiment of the present invention comprises a wavefront measurement system that includes a source of electromagnetic radiation. An imaging system focuses the electromagnetic radiation at an object plane, and directs the illumination uniformly. A first grating is positioned in the object plane for conditioning the illumination reaching the input numerical aperture pupil plane of the PO. The first grating includes a plurality of reflecting lines each formed by a plurality of reflecting dots. A projection optical system projects an image of the first grating onto the focal plane. A second grating is positioned at the focal plane. A detector is positioned in the fringe plane and receives the image of the first grating through the second grating. In one embodiment, the first grating has a pitch that is ½ times (or, in other embodiments, 1 times) a magnification of the projection system times a pitch of the second grating.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings:

FIG. 6 illustrates an example of interference fringes as they appear at the focal plane with the use of the present invention.

FIGS. 7–11 illustrate examples of interference fringes seen at the focal plane with the use of the present invention.

DETAILED DESCRIPTION OF EMBODIMENTS OF THE INVENTION

Reference will now be made in detail to the embodiments of the present invention, examples of which are illustrated in the accompanying drawings.

Figure 1:
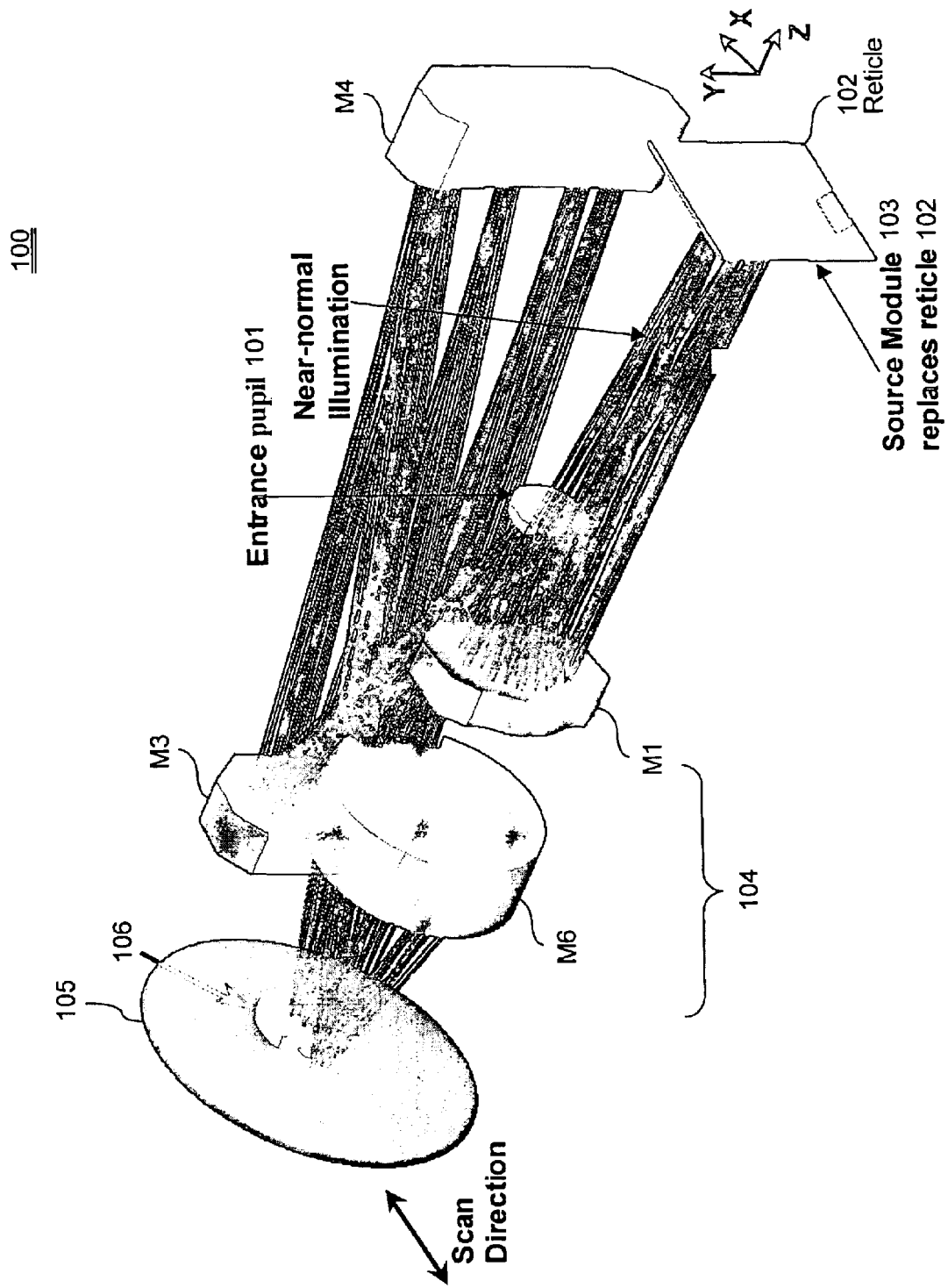
FIG. 1 shows a portion of an EUV photolithographic system.

FIG. 1 illustrates a portion of an EUV photolithographic system 100, which includes an EUV source (not shown in FIG. 1). The system 100 also includes image optics (including mirrors M4 and M3), a pupil 101, a reticle 102 mounted on a reticle stage (RS, not shown) with an image of a pattern to be imaged onto a wafer 105, and projection optics (PO) 104 mirrors M1 and M6. The EUV radiation is then projected onto a wafer 105, which is mounted on a wafer stage (WS, not shown). It will be appreciated that the reticle 102 is reflective in EUV systems, unlike photolithographic systems operating at longer wavelengths, such as deep ultraviolet, or visible, where the reticle 102 is usually transmissive.

As further shown in FIG. 1, in the present invention, a sensor module 106 is placed on the wafer stage, and a source module 103 is placed on the reticle stage, to measure the wavefront. The sensor and source modules 106 may also be referred to as a wavefront sensor (WFS).

Figure 2:
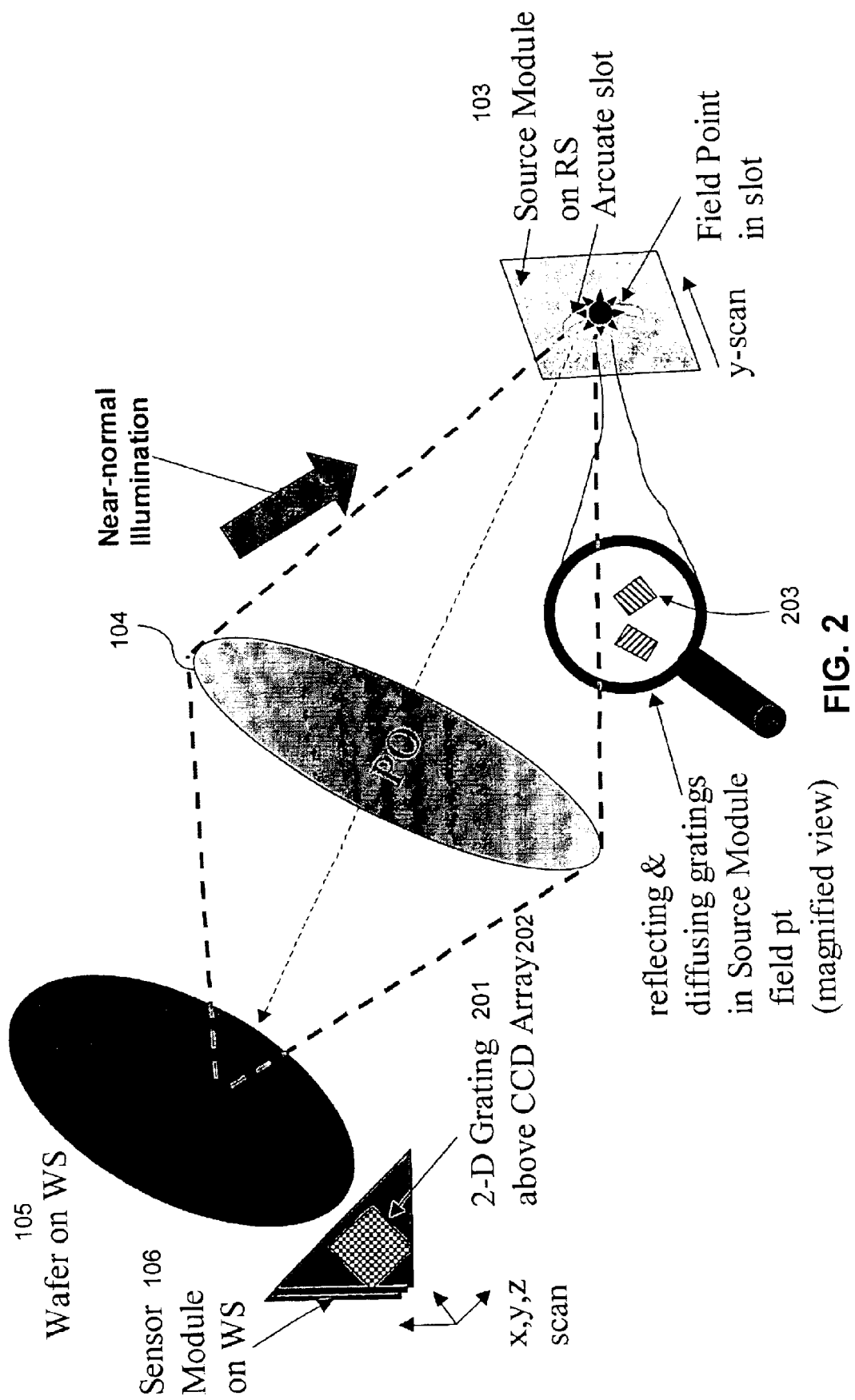
FIG. 2 shows an illustration of how a sensor module and a source module of the present invention fit within the photolithographic system.

FIG. 2 is another illustration of the wavefront measurement apparatus of the present invention, particularly as it can be incorporated into a photolithographic system. As may be seen in FIG. 2, the source module 103 is placed on the reticle stage, and in one embodiment includes two orthogonally oriented gratings. The wavefront sensor (or sensor module 106) is placed on the wafer stage and includes a 2-D grating 201 and a CCD detector 202 that is positioned below the 2-D grating. The projection optics (PO) 104 remain the same as during normal exposure operation.

The wavefront can be measured when imaging is not being performed. In order to measure the wavefront, the reticle stage is moved, such that one of the gratings 203 in the source module 103 on the reticle stage is placed in the optical path, rather than the reticle 102 itself. The wafer stage is also moved such that the wavefront sensor is positioned to receive an image of the source module grating 203. The CCD detector 202 below the 2-D grating 201 then receives and measures the transmitted radiation. The reticle stage can then be moved to place a different diffraction grating in the optical path, so as to measure the wavefront with an orthogonal orientation of the source module grating 203.

Figure 3A:
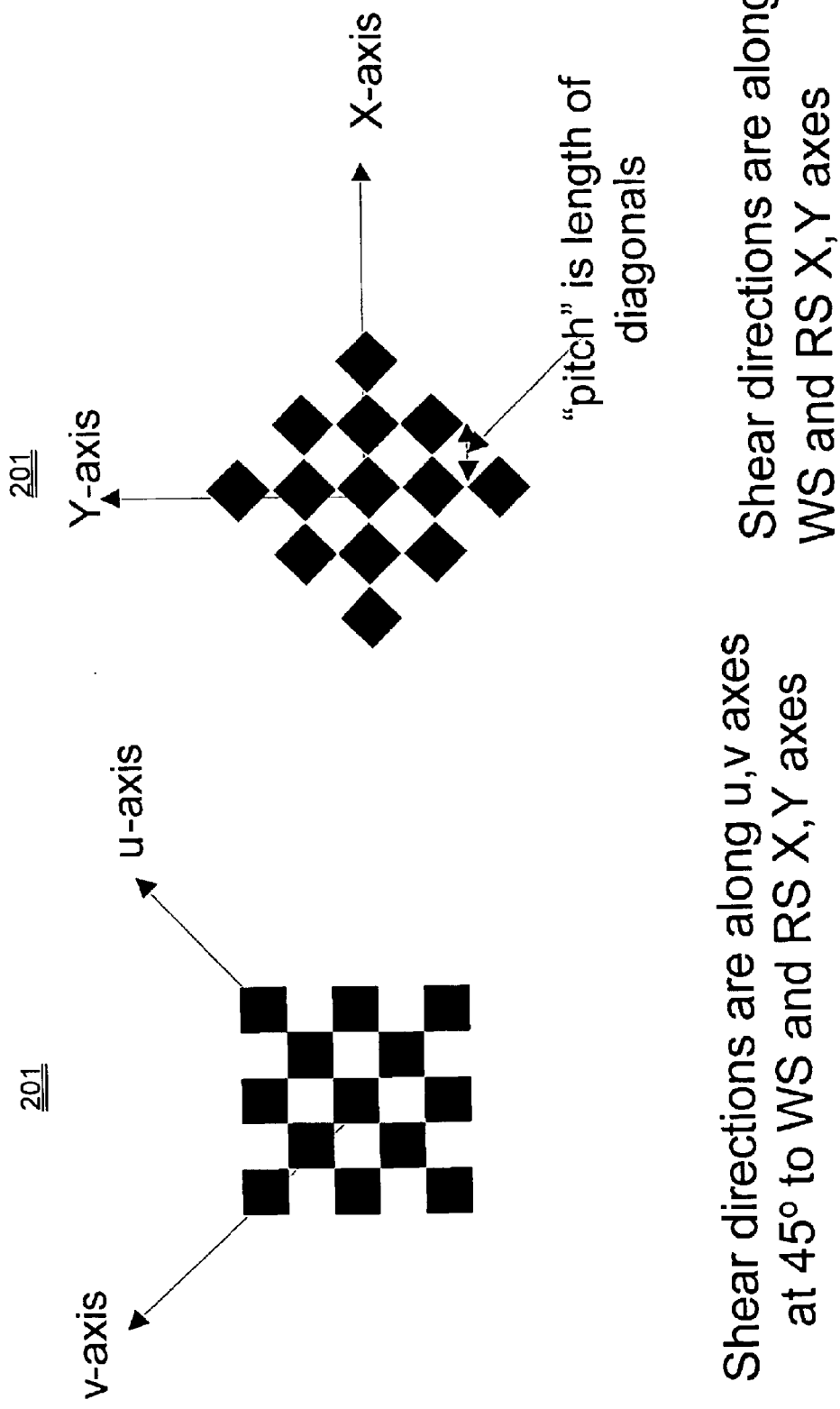
FIG. 3A shows an example of a 2-D checkerboard grating.

FIG. 3A illustrates one embodiment of the 2-D grating 201 of the present invention. As shown in FIG. 3A, a checkerboard grating can be used, with a carefully chosen pitch of the grating. Such a grating can be manufactured on a substrate of, e.g., 100 nanometers thick, made of a material that is transmissive at the exposure wavelength. For example, for 13.5 nanometers, examples of such transmissive materials include silicon and silicon nitride. The 2-D checkerboard diffraction grating 201 thus can be said to have a 50% duty cycle. The primary interference will be of zeroth order and the + and $-1^{st}$ order. Randomized nature of diffuse scattering from source module 103 is expected to effectively wash out spatial variation in the wavefront across the projection optics 104 pupil. Note that, as may be seen in FIG. 3A, the pitch of the 2-D grating 201 is the length of the perpendicular square.

The 2-D grating 201 also includes reflective (or opaque) regions, as may be seen in FIG. 3A. These reflective regions can be formed of materials that absorb EUV radiation (this case, for 13.5 nm exposure wavelength), such as nickel, chromium or other metals.

In one embodiment, the checkerboard grating pitch was chosen as 1.6 microns. Note that the pitch has to be carefully chosen, to cause an appropriate angle for first order diffraction (as discussed below) for a particular shear ratio and numerical aperture. In one preferred embodiment the shear ratio was chosen to be $\frac{1}{30}^{th}$, although it will be appreciated by one of ordinary skill in the art that the invention is not limited to these particular numbers or dimensions. Also, in one particular embodiment, the output numerical aperture of the system is 0.25 (and the input numerical aperture is 0.0625, for 4× magnification), although the invention is not limited to this particular numerical aperture.

As noted above, the pitch of the 2-D grating 201 is chosen in one embodiment to provide a shear ratio of $\frac{1}{30}^{th}$, where the CCD detector 202 is in the fringe plane (i.e., below the focal plane of the system), and "sees" a pattern of fringes (an interferogram) or a number of overlapping circles, as will be discussed further below. The shear ratio is a measure of the overlap of two circles, where a shear ratio of zero represents perfect overlap. Note also that it is desirable for the CCD detector 202 to "see" only the zeroth order and the + and $-1^{st}$ order diffraction images, and to eliminate the + and $-2^{nd}$ order on diffraction images. For this purpose, the use of a checkerboard grating with square transmission and reflection areas, as shown in FIG. 3, is believed to be optimal. Furthermore, the first grating 103 is constructed to aid in eliminating unwanted orders. It is important, however, that whichever pattern of transmission and reflection areas is used, that it be a regular pattern that forms a 2-D grating. It will be appreciated however that other shapes, in addition to square shapes, are possible, e.g., circular reflective areas, or circular transmissive areas, etc., as long as the pattern is regular.

One of ordinary skill in the art will also appreciate that some of the tolerancing concerns between the sensor module 106 and the source module 103 can be resolved by first fabricating the 2-D grating 201 of the sensor module 106, measuring its exact dimensions, and then fabricating the source module gratings 203 accordingly. In a 4× magnification system, the pitch of the linear grating of the source module 103 is preferably exactly 4× the pitch of the 2-D grating 201 of the sensor module 106. Thus, for a 1.6 micron pitch of the 2-D grating 201, the pitch of the source module grating 203 is preferably 6.4 microns. However, if the 2-D grating 201 is measured to be deviating by, e.g., 10% from the nominal value of 1.6, the source module grating 203 can be manufactured accordingly to have a pitch 4× times the measured checkerboard grating pitch. This reduces the need for extreme precision in the manufacture of both sets of gratings simultaneously.

Another embodiment of the 2-D grating 201 is a cross grating, such that two linear gratings of an appropriate pitch are essentially placed one on top of another, with each grating having the appropriate pitch dimension to result in an appropriate combined diagonal pitch. It is believed, however, that the checkerboard grating gives best results.

It will also be appreciated that a checkerboard grating or a cross grating can be used in the source module 103 instead of two separate linear gratings, although the use of a 2-D grating in the source module 103 complicates the detector readout and the analysis mathematics.

It will also be appreciated that although the discussion above is primarily in terms of a EUV photolithography system, where reflective optical elements are typically used (such as the source module gratings 203, the projection optics 104, and the imaging optics), the invention is equally applicable to other wavelengths used in the photolithographic system, with appropriate transmissive/refractive components used in place of reflective ones, as appropriate.

The pitch of the source module grating 203 is also chosen to make interference between + and $-1^{st}$ order images disappear.

Figure 3B:
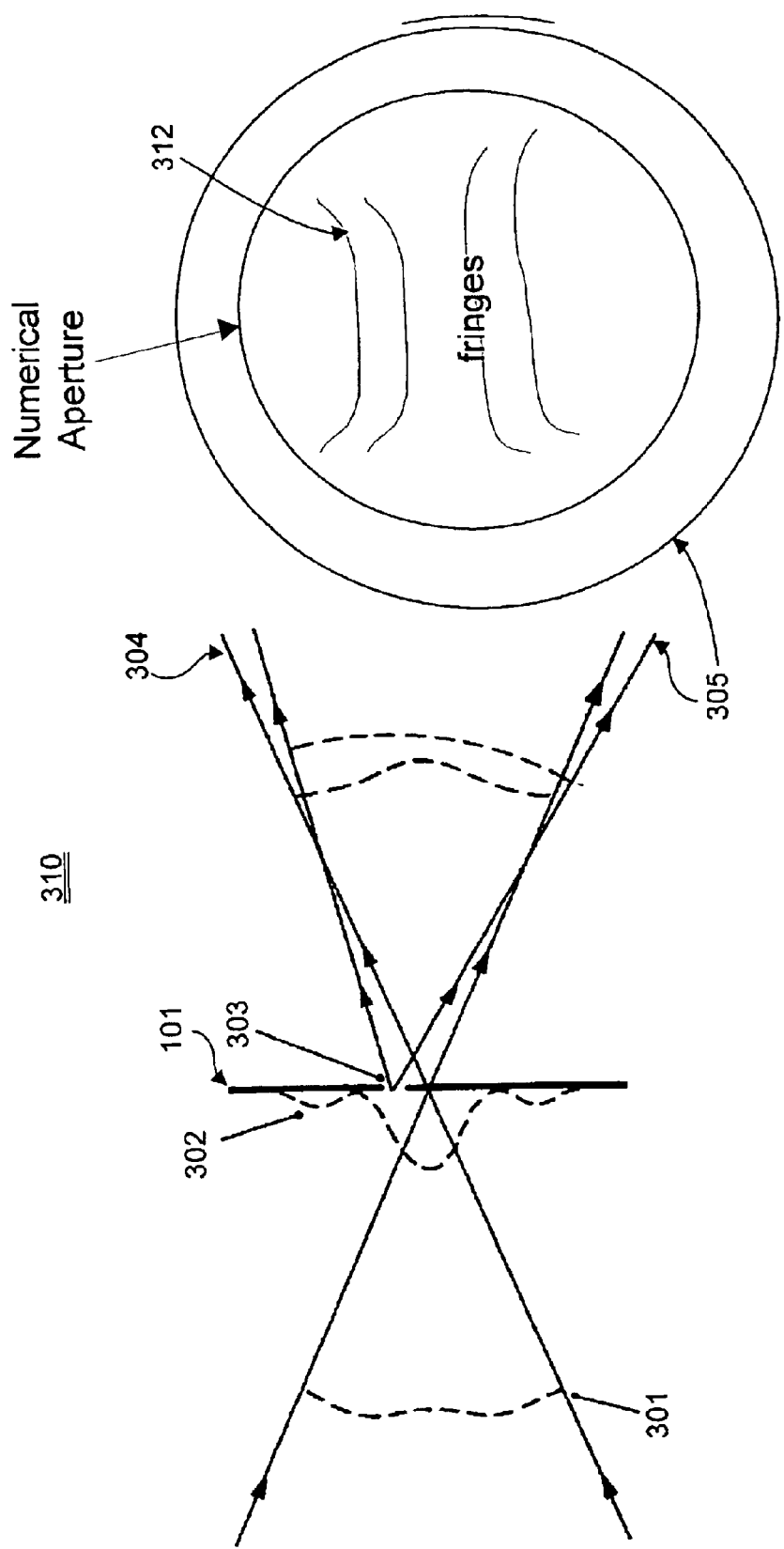
FIGS. 3B and 4 illustrate the use of an interferometer to produce shear wavefronts.
Figure 4:
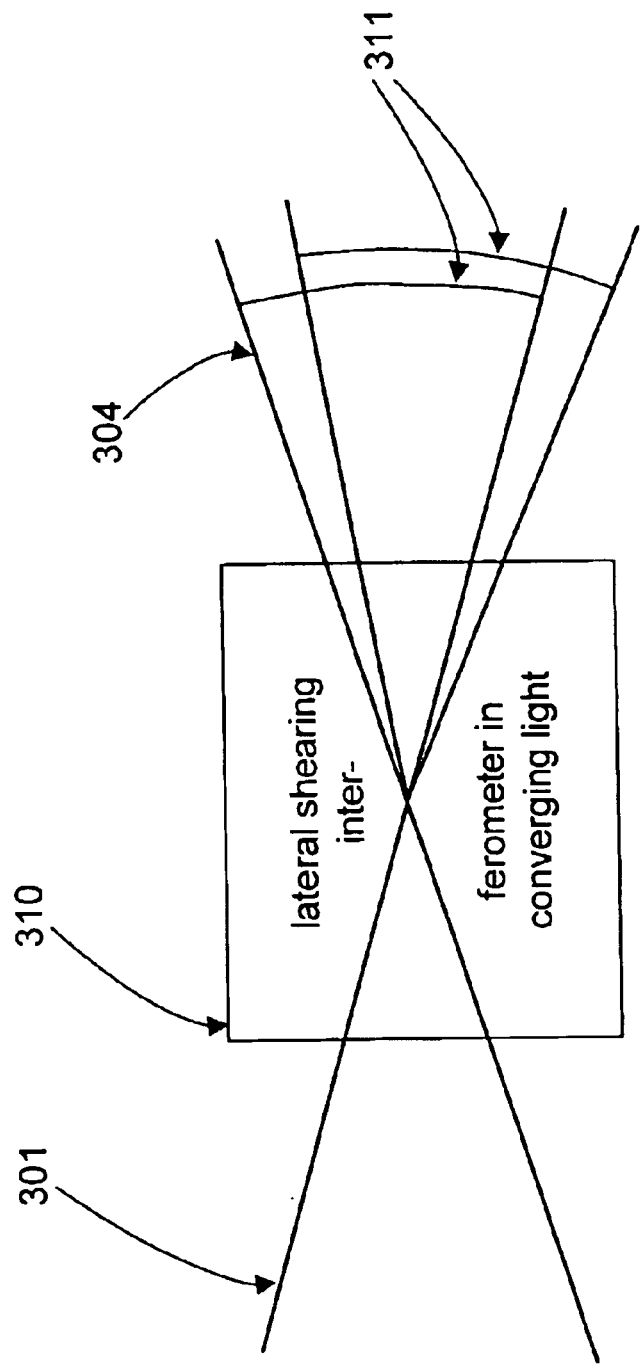

FIGS. 3B and 4 illustrate the use of a pupil in a lateral shearing interferometer 310 to produce reference wavefronts and shear wavefronts. (See also the entrance pupil 101 in FIG. 1). As shown in FIGS. 3B and 4, a wavefront 301 converges at a point in space, while emanating from a primary source. An image of a point source 302 exists at an entrance pupil 101. A partially transmitting film may be placed at the entrance pupil 101. A pinhole 303 is positioned at the entrance pupil 101. The pinhole 303 generates a transmitted wave 304 with a wavefront 311, which includes a diffracted spherical reference wave 305. Thus, the lateral shearing interferometer 310 creates one or more apparent sources, whose wavefronts 311 interfere to produce fringes 312.

Figure 5:
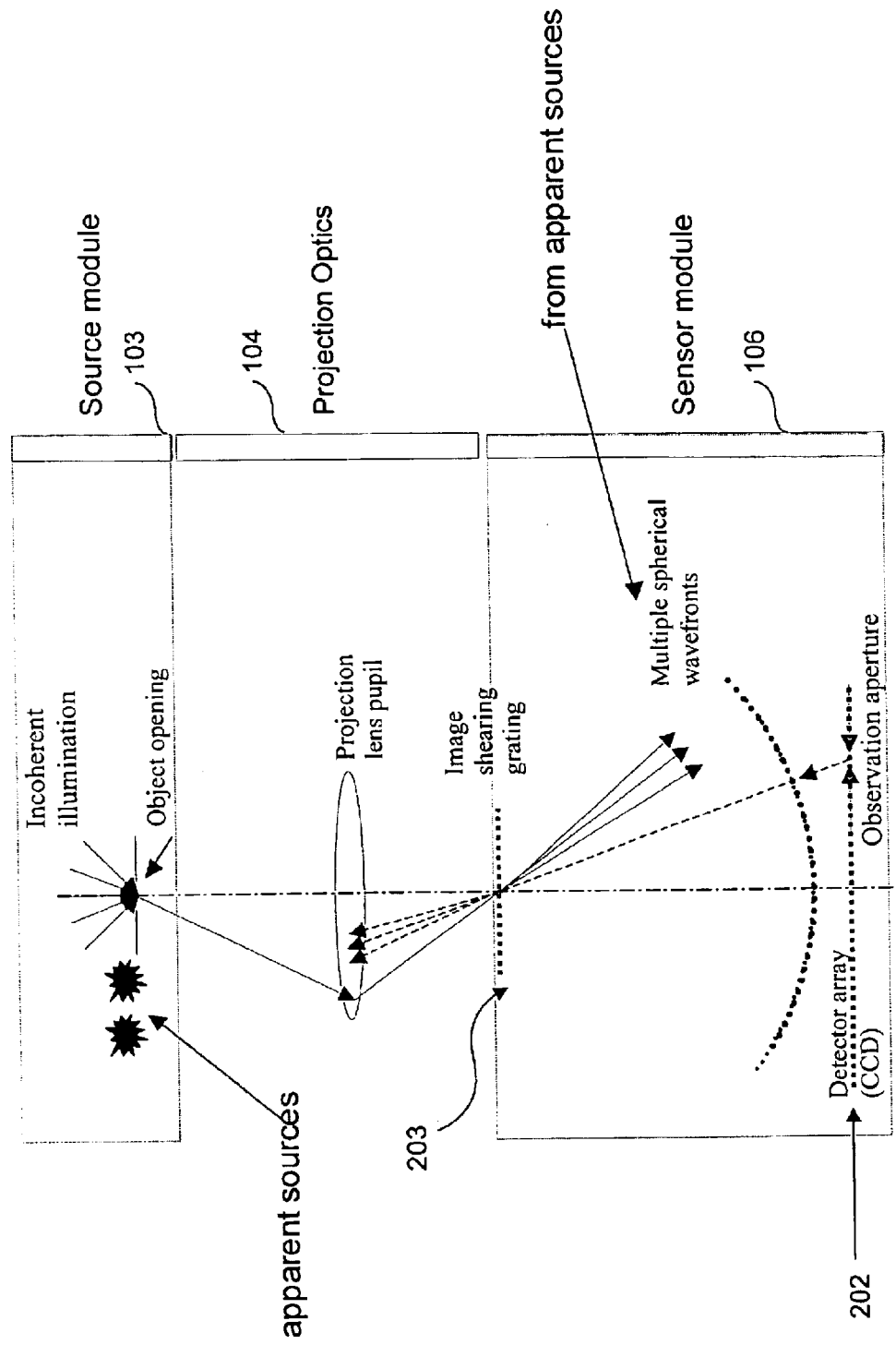
FIG. 5 is another schematic illustrating the present invention as used within a photolithographic tool.
Figure 9:
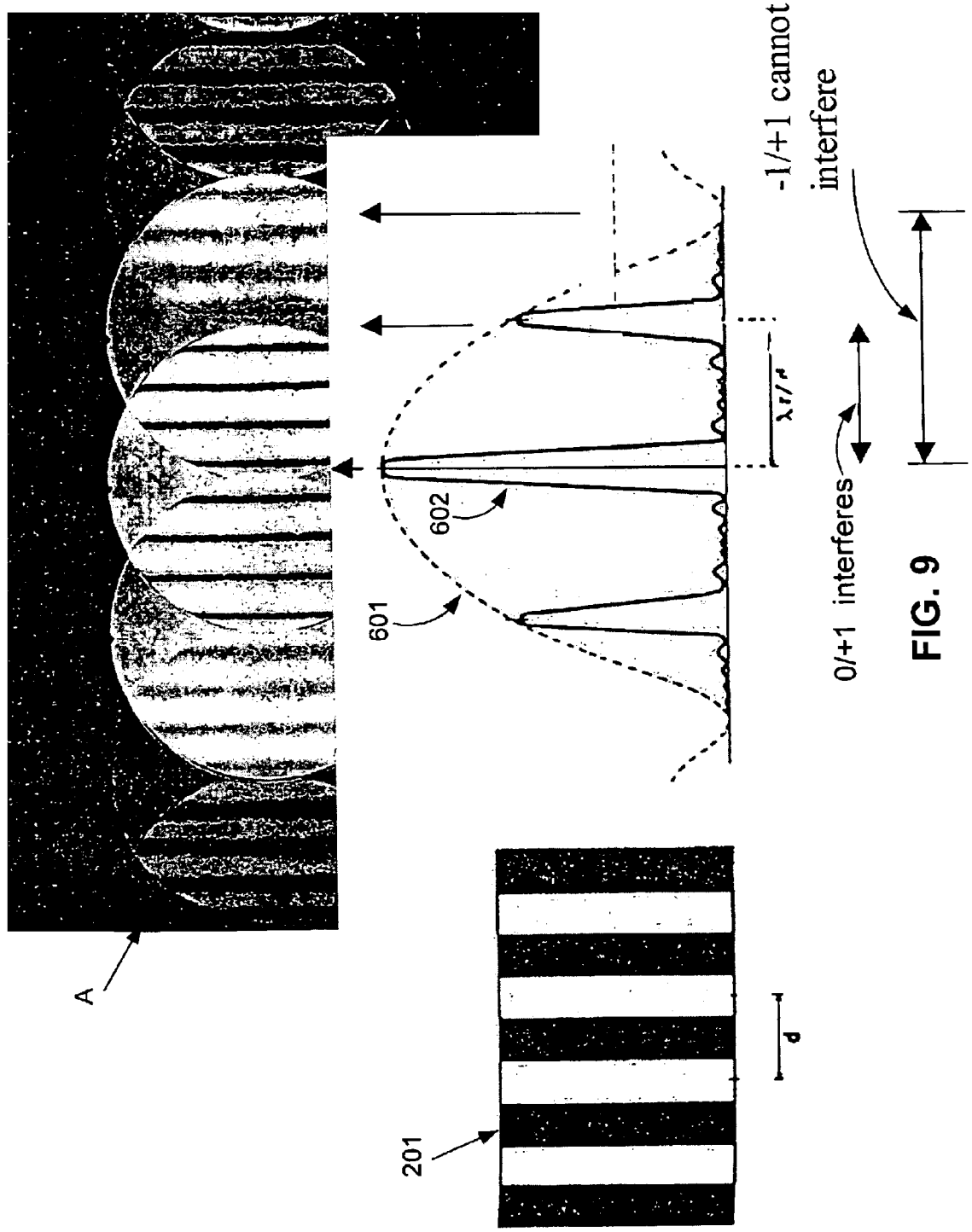

FIG. 5 is another illustration of the wavefront measurement system of the present invention, showing the source module 103 positioned in the object plane (reticle 102 plane, not labeled in the figures) and the projection optics 104. An image shearing grating 203 positioned on the wafer stage, and generates multiple wavefronts that are then detected in the sensor module 106.

FIG. 6 illustrates the wavefront fringes (312 in FIG. 3) as seen by the CCD detector 202. As shown in FIG. 6, in the upper right-hand photograph, sheared fringes for a single object space slit are shown, where the slit is positioned in front of an incoherent, diffuse source that fills the maximum numerical aperture and smoothes any wavefront inhomogeneities. The bottom right-hand figure shows a fringe visibility function 601, with zeroth order and first order diffraction patterns. The 50% duty cycle on the grating 203 makes all even orders of the diffraction pattern invisible. At the bottom left of FIG. 6, the image space sharing grating 201 is shown, with a shear ratio of 0.5.

FIGS. 7–11 illustrate exemplary wavefronts as seen by the CCD detector 202, for different shear ratios.

Figure 10:
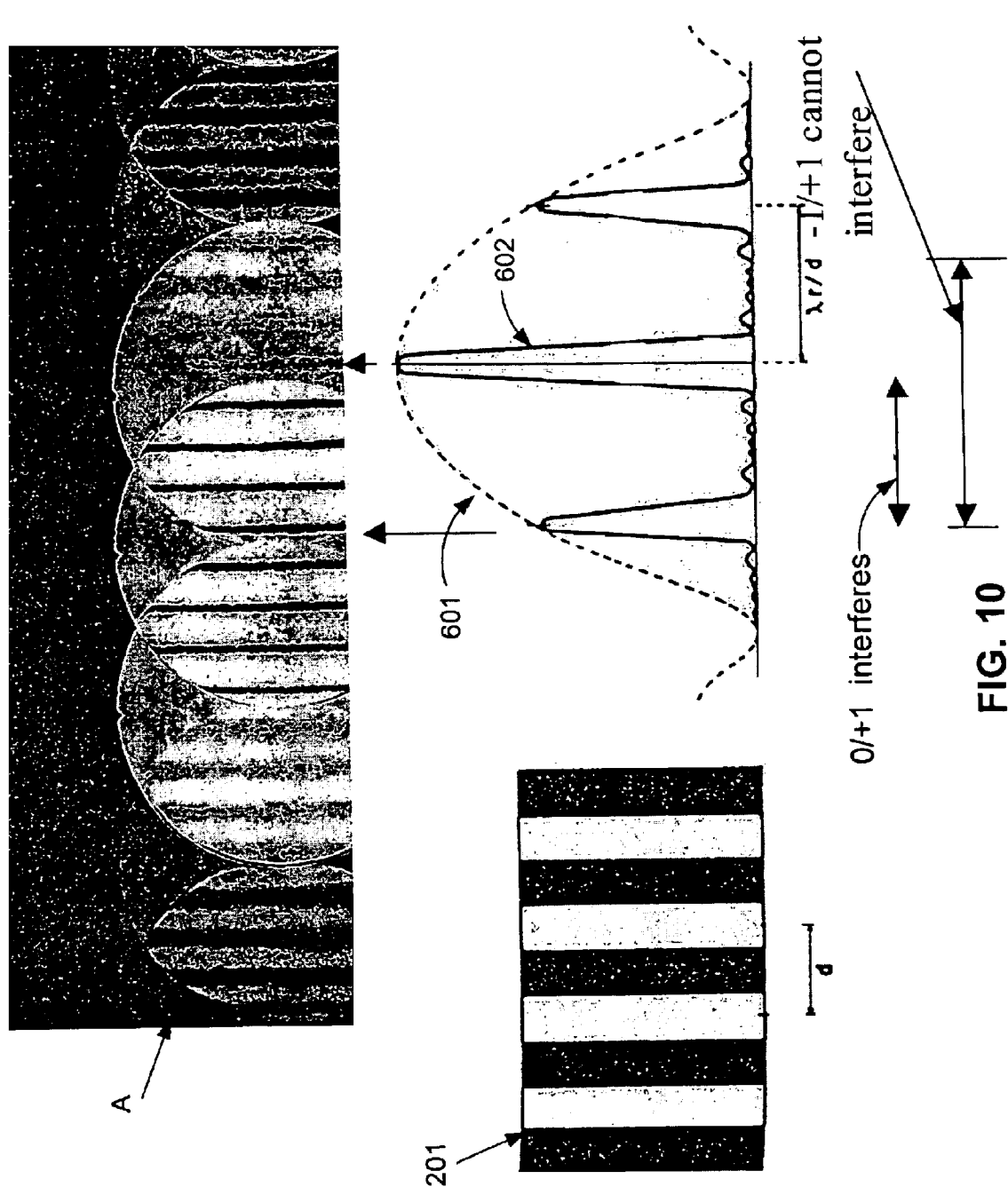
Figure 11:
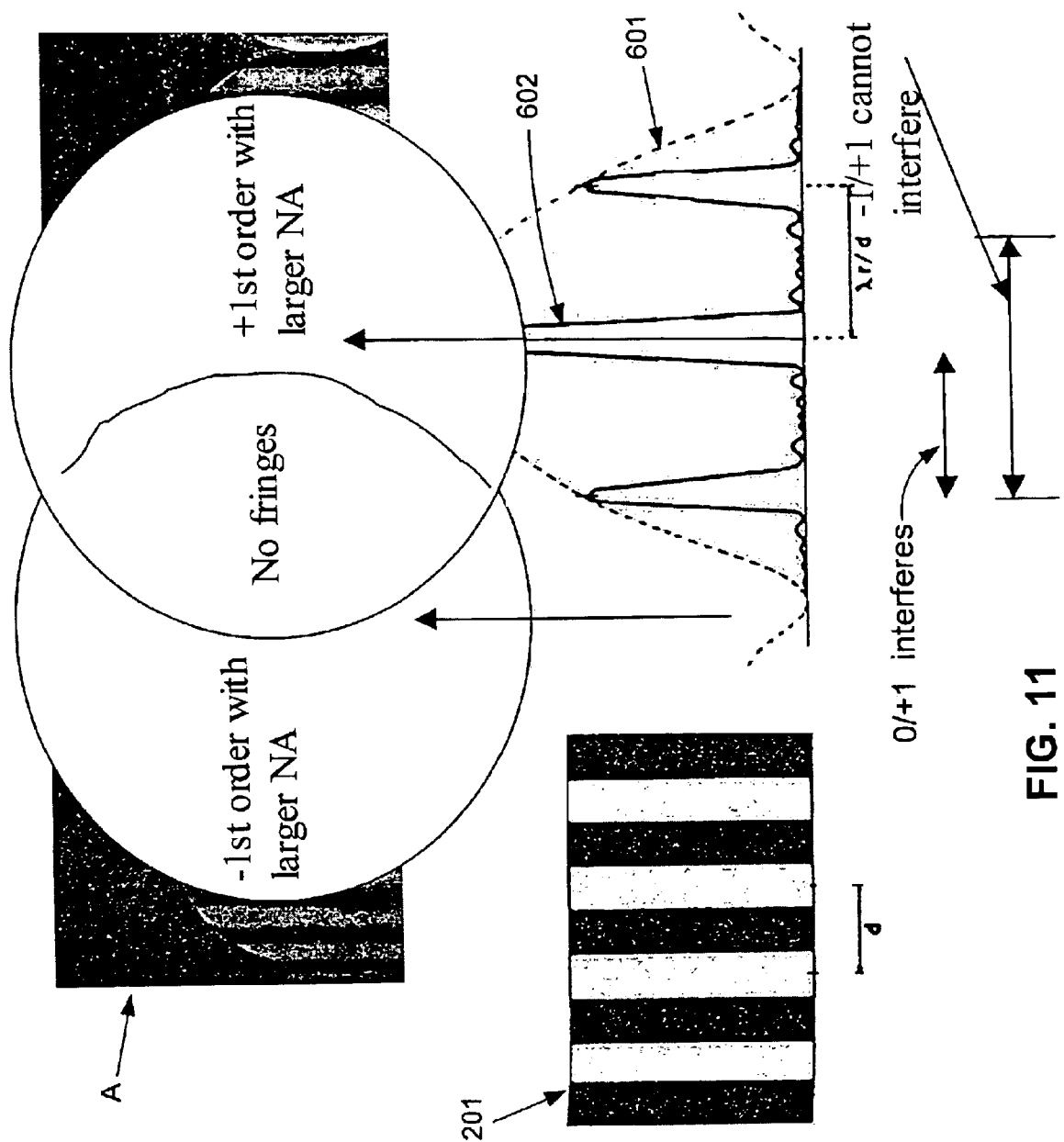

With further reference to FIGS. 1 and 10, the wavefront can be further analyzed by taking a number of images N at the CCD detector 202 while scanning the reticle stage by linewidth/N at a time. For a 6.4 micron pitch of the grating 203, and 16 images, the reticle stage is scanned by 6.4 microns/16=400 nm at a time. The images may then be combined to produce a better analysis than would be available from a single image.

A particular problem that frequently exists in many EUV photolithographic systems is that the EUV source does not provide uniform information, but instead has a number of facets, or hot spots, in its exit pupil that result from use of flies' eye lenses in the optics of the EUV source. This results in a non-uniform wavefront at the input numerical aperture of the pupil of the PO 104, or sometimes, in underfilled numerical aperture of the PO. For example, the particular system of one embodiment of the present invention has an input numerical aperture of 0.0625 for the projection optics 104, and an output numerical aperture of 0.25. Thus, it is desirable to be able to eliminate the underfilling and intensity nonuniformity at the input numerical aperture of the PO 104. Note that the problems discussed above affect the measurement of the wavefront by the wavefront sensor discussed above.

Figure 12:
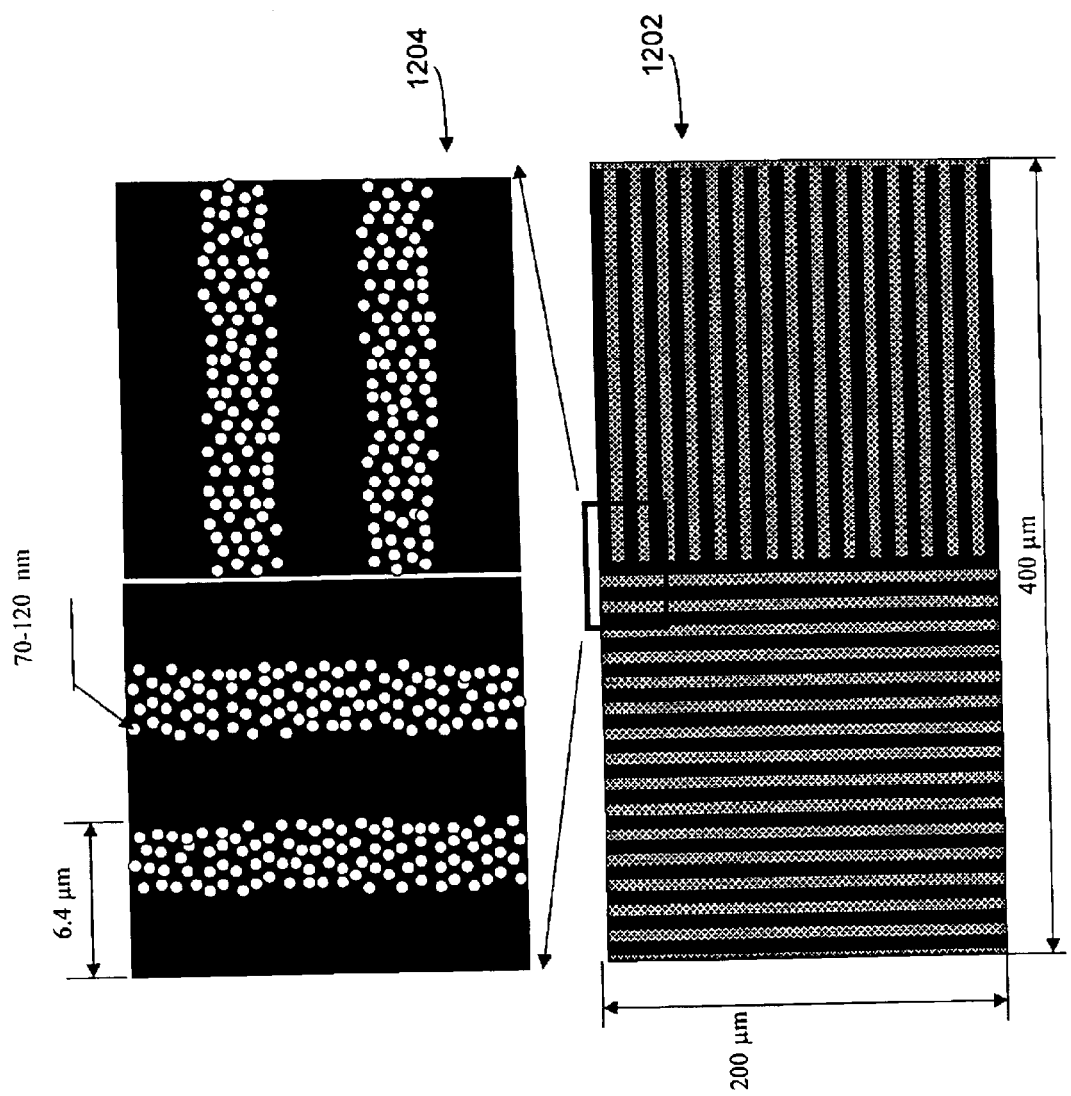
FIG. 12 illustrates one embodiment of a source module grating using a random pattern of reflecting dots.

FIG. 12 illustrates one proposed solution for overcoming these problems. As shown in FIG. 12, which illustrates one type of a linear grating, each reflecting line of the grating is formed not of a continuous reflecting stripe (or line), but instead of a plurality of reflecting dots. The reflecting dots can be randomly scattered, as shown in FIG. 12, or can be arranged in a regular matrix pattern. Thus, as may be seen from FIG. 12, the lines of the grating 1202 of the source module, when seen "from far away," appear to be solid lines, as discussed above. However, when viewed "up close" (as illustrated at 1204), they are instead made up of a number of reflecting dots. The remainder of the material, for EUV application, would be absorbing.

The grating lines are chosen as already stated to have a direct relation to the $2^{nd}$ grating lines so as to further maximize the use of the object plane illumination, preserve fringe visibility at the detector, and eliminate + and −1 order fringes.

In one embodiment, the diameter of the dots, for the parameters discussed above (6.4 $\mu$m for 4× magnification, 0.25 output numerical aperture, 0.0625 input numerical aperture, 13.5 nm source) is between 70 and 120 nm, preferably close to 70 nm.

The bottom portion of FIG. 12 shows the overall arrangement of two orthogonally oriented gratings that collectively form the source module grating 201 of the present invention. As may be seen in the bottom portion of FIG. 12, the reflecting dots can be arranged in two adjacent orthogonal patterns, each approximately 200 $\mu$m by 200 $\mu$m.

It will be appreciated that with the use of the reflecting dots of the present invention, the single diffraction pattern, as shown in FIG. 10, for example, becomes a diffraction pattern within a diffraction pattern. Thus, each reflecting dot becomes a wavefront source, as viewed from the focal plane. Therefore, irregularities in intensity, particularly due to fly's eye facets of the source, will disappear, presenting a clean, regular image of the source at the focal plane. The reflecting dot pattern of the grating 201 also has the advantage that it overfills the 0.0625 numerical aperture of the projection optics, and utilizes as much light that is incident onto the grating 201 as possible. Furthermore, no additional pupil facets or pupil structure is introduced if illumination is spatially incoherent. The reflecting dot grating shown in FIG. 12 can be fabricated on a standard reticle blank. The dot diameter is preferably chosen to more than overfill the numerical aperture, so as to provide near-uniform pupil illumination.

Additionally, a factor of 2 drop-off in intensity can be allowable for each dot, since photon noise-limited elemental detection signal-to-noise ratio increases only by the square root of two. Note also that larger diameters can be desirable due to manufacturability issues. Calculations show that a 44 nm diameter dot gives a 10% drop-off, a 66 nm diameter dot gives a 20% drop-off, and a 112 nm diameter dot gives a 50% drop-off, for example.

Thus, the reflecting dot grating 201 of the present invention is an example of a reflective EUV scattering device, that in this case has 0.4% efficiency for the large number of dots and first grating size, with an additional goal of maximizing the efficiency. Efficiency here is defined as the fraction of the illumination power falling within the desired numerical aperture after reflection from the device, as compared to a Lambertian diffuser.

A tailored reflecting EUV diffractor fills the input numerical aperture of the projection optics, to eliminate pupil facets due to the Illumination Subsystem, and to maximize utilization of the illumination for optical system aberration measurements at EUV wavelengths using a lateral grating shearing interferometer. The last requires the equivalent of a grating placed in front of the incoherent extended source in the reticle plane. The first two require that the input illumination be reflected by a diffractor with a more favorable pattern than a Lambertian diffuser. The tailored reflecting diffractor may be an ensemble of micro-reflector diffraction-limited dots in the form of a grating. The individual reflecting dots in that ensemble would be placed at the "slits" of the 50% duty cycle "grating" and each individual reflecting dot of the size and shape to fill by diffraction the input numerical aperture of the optics being measured. For a numerical aperture of 0.0625 at 13.5 nm, the dot diameter might be 70 nm (to 210 nm). A single 70 nm dot would yield about 0.01 "detectable" EUV photon in EUV ILIAS. However, a 50% duty cycle "grating" 300 $\mu$m long, with 45 lines of pitch 6.4 $\mu$m, and with dots only along the central axis of each line, could accommodate enough spots to yield up to 1,000

"detectable" photons which is more than adequate for EUV ILIAS. "Grating" lines filled with dots would give larger signals. A single (dotted) line would give an inadequate signal. A Lambertian diffuser and regular grating of similar form would give a barely adequate signal.

The reflecting dots could have different heights so as to give them phase differences and so serve to eliminate the center bright spot of the prior random pattern. The random phases due to random heights serve the same purpose. However, the speckle in the presence of partially coherent illumination may be a problem for some applications. The reflecting dots can be placed regularly without the phase steps, and such regular placement may trade speckle for less troublesome very low frequency artifacts.

When the reflecting dots are placed randomly within the grating lines, speckle appears in the fringe pattern, as well as a bright spot at the center. The bright center can be eliminated by making the reflecting dots of random height with a standard deviation of many times the wavelength (i.e., OPD many times $\pi$ plus a fraction. When dots are placed in regular pattern, the overlapping fringe artifacts in the fringe plane can likewise be eliminated (but causing speckle) by making the dots of random height with an optical path difference standard deviation of many times $\pi$. However, the fringe artifacts may have less impact on fringe analysis.

The basis for coherence area (CA) due to mask size and configuration is as follows: An heuristic justification shows that the pitch of image space grating for a shear of $\frac{1}{30}$ is 1.6 $\mu m$ (i.e., 30×13.5/0.25). The grating is placed with same orientation over source whose pitch is magnification ×1.6 $\mu m$ or 6.4 $\mu m$. The image of object space grating overlaps image space grating. Alternatively, object space grating slits place real sources at positions of image space grating apparent sources.

Figure 13:
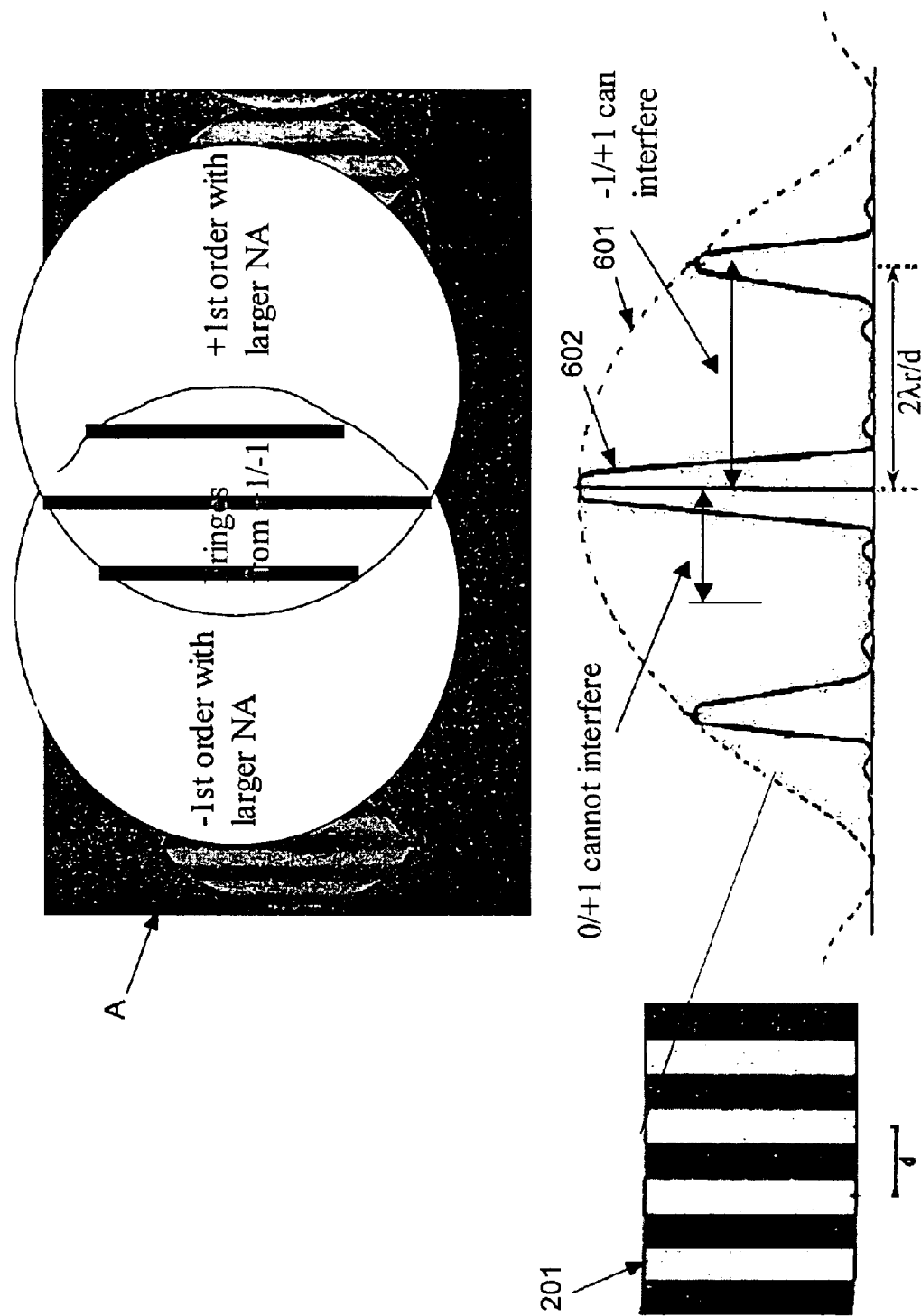
FIG. 13 illustrates a fringe pattern for a source module grating using ½ times a magnification of the projection system times a pitch of the second grating for achromatic operation.

The benefits of using a grating at the source as coherence area mask vs. a single slit (or pinholes) are as follows:

It increases utilization of reticle illumination (after a diffuser). It causes all even coherence orders to be missing for 50% duty cycle of pitch already absent from the shear grating in image space. Object space "spatial filtering" becomes possible. For 50% duty cycle, +1/−1 orders do not interfere (grating pitch=magnification×shear grating pitch), only 0/1. Other spatial filtering is possible. e.g., +1/−1 interfere, 0/1 not interfere, etc., for improved achromaticity. FIG. 13 illustrates a fringe pattern for a source module grating using ½ times a magnification of the projection system times a pitch of the second grating for achromatic operation.

For example, in one embodiment, an object space grating of less than 25% duty cycle and pitch equal to demagnification/2× image space grating pitch will cause +1/−1 orders to interfere, 0/+1 and 0/−1 not to interfere, to improve achromaticity and maximize utilization of field source light. In one embodiment, the first grating has a pitch that is ½ times a magnification of the projection system times a pitch of the second grating. A wide range of object space coherence function tailoring can be implemented in this manner. Note that the same effect can be achieved with image space spatial frequency filtering, although such an approach may be more difficult. Note also that this approach may be combined with the reflecting dots described above, or may be used by itself, without the reflecting dots.

Object space grating is also important in obtaining fringe phase-shifting in two orthogonal directions (two object space gratings). Two separate gratings at 45 degrees are used to accomplish lateral motion. The cross-grating in image space is likewise at 45 degrees.

Phase-shift one family of fringes can be accomplished by translating each object space grating. Translation causes the phase of the 1st order to vary with regard to 0th order and phase-shifts fringes.

Achromaticity of a Grating Lateral Shearing Interferometer (GLSI), requires two conditions: the fringe spacing must be independent of source wavelength and the fringe pattern origin at each wavelength must independent of wavelength. GLSI's are often claimed to be achromatic, but that is true generally for only a few lower order aberrations and only for the fringe spacing part. The choice of orders for interference in GLSI's will affect the second part of achromaticity. That is, +1/−1 order interference has both fringe spacing and fringe origin achromaticity whereas 0/1 order interference has only fringe spacing achromaticity (for lower order aberrations). Expanding the fringe pattern of two adjacent orders in a Taylor series leads to:

a term containing only the first derivative of the wavefront (and no wavelength); and a term containing the third derivative of the wavefront and the square of the wavelength.

Therefore, if the wavefront has only the classic aberrations of defocus, third order astigmatism, and low order coma for which the third derivative vanishes, the fringe spacing does not depend on wavelength and the GLSI is achromatic. Thus, the use of the object space grating of the stated pitch combines with the image plane shear grating to provide achromaticity. That is, the system will work despite change in wavelength of source or despite broad spectral width of source.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A wavefront measurement system comprising:
   an imaging system that directs electromagnetic radiation from a source at an object plane so as to uniformly illuminate the object plane;
   a first grating positioned in the object plane;
   a projection optical system that projects an image of the first grating onto a focal plane;
   a second grating at the focal plane; and
   a detector that receives a fringe pattern produced by the second grating,
   wherein the first grating has a pitch that is ½ times a magnification of the projection system times a pitch of the second grating.

2. The system of claim 1, wherein the fringe pattern does not have the zeroth-first order fringe pattern.

3. The system of claim 1, wherein the first grating including a plurality of reflecting lines each formed by a plurality of reflecting dots.

4. The system of claim 3, wherein the reflecting dots are between 70 nm and 120 nm in diameter.

5. The system of claim 3, wherein the reflecting dots have a random height with a standard deviation of many times a wavelength.

6. The system of claim 3, wherein the reflecting dots are arranged in a random pattern within each line.

7. The system of claim 3, wherein the reflecting dots are arranged in a regular pattern within each line.

8. The system of claim 3, wherein the reflecting dots create an illumination that overfills a numerical aperture of the projection optical system.

9. The system of claim 3, wherein the reflecting dots create an illumination free of irregularities caused by the source.

10. The system of claim 3, wherein the plurality of reflecting lines of the first grating are arranged to maximize intensity and visibility of the fringe pattern.

11. The system of claim 3, wherein the plurality of lines are arranged in two orthogonal directions.

12. The system of claim 11, wherein the plurality of lines are arranged as a checkerboard grating.

13. The system of claim 11, wherein the plurality of lines are arranged as two linear gratings.

14. The system of claim 11, wherein the plurality of lines of the first grating are oriented at 45 degrees relative to the second grating.

15. The system of claim 1, wherein the source is an Extreme Ultraviolet (EUV) radiation source.

16. The system of claim 1, wherein the first grating is mounted on a reticle stage.

17. The system of claim 1, wherein the second grating is mounted on a wafer stage.

18. A wavefront measurement system comprising:
an imaging system that focuses electromagnetic radiation from a source at an object plane;
a first grating in the object,
a projection optical system that projects an image of the first grating onto a focal plane;
a second grating at the focal plane; and
a detector that receives a fringe pattern produced by the second grating,
wherein the fringe pattern does not have the zeroth-first order fringes.

19. The system of claim 18, wherein the first grating has a pitch that is ½ times a magnification of the projection system times a pitch of the second grating.

20. The system of claim 18, wherein the first grating including a plurality of reflecting lines each formed by a plurality of reflecting dots.

21. The system of claim 20, wherein the reflecting dots are between 70 nm and 120 nm in diameter.

22. The system of claim 20, wherein the reflecting dots have a random height with a standard deviation of many times a wavelength.

23. The system of claim 20, wherein the reflecting dots are arranged in a random pattern within each line.

24. The system of claim 20, wherein the plurality of lines are arranged in two orthogonal directions.

25. The system of claim 20, wherein the plurality of lines are arranged as a checkerboard grating.

26. The system of claim 20, wherein the plurality of lines are arranged as two linear gratings.

27. A wavefront measurement system comprising:
an imaging system that focuses electromagnetic radiation from a source at an object plane;
a first grating positioned on a reticle stage to generate a diffraction pattern at a focal plane;
a projection optical system that projects an image of the first grating onto the focal plane;
a second grating in the focal plane that receives a diffracted image of the first grating; and
a detector that receives the image of the first grating through the second grating,
wherein the first grating has a pitch that is ½ times a magnification of the projection system times a pitch of the second grating.

28. A system for EUV photolithography comprising:
an EUV source emitting EUV radiation;
an imaging system that illuminates an object plane with the EUV radiation;
a reticle stage for mounting a reticle in an object plane;
a first grating on the reticle stage for conditioning an illumination from the source at the object plane;
a projection optical system that optically conjugates a focal plane and the object plane;
a second grating in the focal plane and on a wafer stage; and
a detector on the wafer stage after the second grating that receives the image of the first grating through the second grating,
wherein the first grating has a pitch that is ½ times a magnification of the projection system times a pitch of the second grating.

29. A method of measuring a wavefront of an optical system comprising:
generating electromagnetic radiation at a source;
focusing the electromagnetic radiation at an object plane of the optical system;
positioning a first grating in an optical path of the optical system to condition the electromagnetic radiation at the object plane;
conjugating a focal plane and the object plane;
positioning a detector below the focal plane and a second grating at the focal plane;
receiving an image of the source through the second grating; and
calculating wavefront parameters from the image,
wherein the first grating has a pitch that is ½ times the magnification of the projection system times the pitch of the second grating.

30. The method of claim 29, further including the step of phaseshifting a readout of the fringe pattern by stepping the first grating in a lateral direction and reading each frame with the detector.

31. A wavefront measurement system comprising:
an imaging system that focuses electromagnetic radiation from a source at an object plane;
a first grating positioned in the object plane;
a projection optical system that projects an image of the first grating onto a focal plane;
a second grating at the focal plane; and
a detector that receives a fringe pattern produced by the second grating,
wherein the first grating including a plurality of reflecting lines each formed by a plurality of reflecting dots.

32. The system of claim 31, wherein the reflecting dots are between 70 nm and 120 nm in diameter.

33. The system of claim 31, wherein the reflecting dots have a random height with a standard deviation of many times a wavelength.

34. The system of claim 31, wherein the reflecting dots are arranged in a random pattern within each line.

35. The system of claim 31, wherein the reflecting dots are arranged in a regular pattern within each line.

36. The system of claim 31, wherein the reflecting dots create an illumination that overfills a numerical aperture of the projection optical system.

37. The system of claim 31, wherein the reflecting dots create an illumination free of irregularities caused by the source.

38. The system of claim 31, wherein the plurality of reflecting lines of the first grating are arranged to maximize intensity and visibility of the fringe pattern.

39. The system of claim 31, wherein the plurality of lines are arranged in two orthogonal directions.

40. The system of claim 31, wherein the plurality of lines are arranged as a checkerboard grating.

41. The system of claim 31, wherein the plurality of lines are arranged as two linear gratings.

42. The system of claim 31, wherein the plurality of lines of the first grating are oriented at 45 degrees relative to the second grating.

43. The system of claim 31, wherein the source is an Extreme Ultraviolet (EUV) radiation source.

44. The system of claim 31, wherein the first grating has a pitch that is ½ times a magnification of the projection system times a pitch of the second grating.

45. A method of measuring a wavefront of an optical system comprising:
generating electromagnetic radiation at a source;
focusing the electromagnetic radiation at an object plane of the optical system;
positioning a first grating in an optical path of the optical system to condition the electromagnetic radiation at the object plane;
conjugating a focal plane and the object plane;
positioning a detector below the focal plane and a second grating at the focal plane;
receiving an image of the source through the second grating; and
calculating wavefront parameters from the image,
wherein the first grating including a plurality of reflecting lines each formed by a plurality of reflecting dots.

46. A wavefront measurement system comprising:
an imaging system that directs electromagnetic radiation from a source at an object plane so as to uniformly illuminate the object plane;
a first grating positioned in the object plane;
a projection optical system that projects an image of the first grating onto a focal plane;
a second grating at the focal plane; and
a detector that receives a fringe pattern produced by the second grating,
wherein the first grating has a pitch that is 1 times a magnification of the projection system times a pitch of the second grating.

47. A system for EUV photolithography comprising:
an EUV source emitting EUV radiation;
an imaging system that illuminates an object plane with the EUV radiation;
a reticle stage for mounting a reticle in an object plane;
a first grating on the reticle stage for conditioning an illumination from the source at the object plane;
a projection optical system that optically conjugates a focal plane and the object plane;
a second grating in the focal plane and on a wafer stage; and
a detector on the wafer stage after the second grating that receives the image of the first grating through the second grating,
wherein the first grating has a pitch that is 1 times a magnification of the projection system times a pitch of the second grating.

48. A wavefront measurement system comprising:
a source of electromagnetic radiation;
an imaging system that focuses the electromagnetic radiation at an object plane;
a first grating positioned in the object plane that conditions the electromagnetic radiation, the first grating including a plurality of reflecting lines each formed by a plurality of reflecting dots;
a projection optical system that projects an image of the first grating onto a focal plane;
a second grating at the focal plane; and
a detector behind the second grating that receives a fringe pattern produced by the second grating.

49. The system of claim 48, wherein the reflecting dots are between 70 nm and 120 nm in diameter.

50. The system of claim 49, wherein the electromagnetic radiation is 13.5 nm.

51. The system of claim 48, wherein the reflecting dots are arranged in a random pattern within each line.

52. The system of claim 48, wherein the reflecting dots are arranged in a regular pattern within each line.

53. The system of claim 48, wherein the reflective dots create an illumination that overfills a numerical aperture of the projection optical system.

54. The system of claim 48, wherein the reflective dots create an illumination free of irregularities caused by the source.

55. The system of claim 48, wherein the plurality of reflecting lines of the first grating are arranged to maximize intensity and visibility of the fringe pattern.

56. The system of claim 48, wherein the plurality of lines are arranged in two orthogonal directions.

57. The system of claim 56, wherein the plurality of lines are arranged as a checkerboard grating.

58. The system of claim 56, wherein the plurality of lines are arranged as two linear gratings.

59. The system of claim 48, wherein the source is an Extreme Ultraviolet (EUV) radiation source.

60. The system of claim 48, wherein the first grating is mounted on a reticle stage.

61. The system of claim 48, wherein the second grating is mounted on a wafer stage.

62. The system of claim 48, wherein the plurality of lines of the first grating are oriented at 45 degrees relative to the second grating.

63. The system of claim 48, wherein a pitch of the first grating is equal to a pitch of the second grating times a magnification factor of the projection optical system.

64. The system of claim 48, wherein the reflecting dots have a random height distribution.

65. A wavefront measurement system comprising:
a source of electromagnetic radiation;
an imaging system that focuses the electromagnetic radiation at an object plane;
a first grating positioned on a reticle stage that generates a diffraction pattern at a focal plane, the first grating including a plurality of reflecting lines each formed by a plurality of reflecting dots;
a projection optical system that projects an image of the first grating onto the focal plane;
a second grating positioned on a wafer stage in the focal plane that receives a diffracted image of the first grating; and
a detector positioned on the wafer stage below the second grating that receives the image of the first grating through the second grating.

66. The system of claim 65, wherein the reflecting dots are between 70 nm and 120 nm in diameter.

67. The system of claim 65, wherein the reflecting dots are arranged in a random pattern within each line.

68. The system of claim 65, wherein the reflecting dots are arranged in a regular pattern within each line.

69. The system of claim 65, wherein the reflective dots create a fringe pattern that overfills a numerical aperture of the projection optical system.

70. The system of claim 65, wherein the plurality of lines are arranged in two orthogonal directions.

71. The system of claim 65, wherein the source is an Extreme Ultraviolet (EUV) radiation source.

72. The system of claim 65, wherein the source is a 13.5 nm radiation source.

73. The system of claim 65, wherein the first grating is mounted on a reticle stage.

74. The system of claim 65, wherein the second grating is mounted on a wafer stage.

75. The system of claim 65, wherein the plurality of lines are oriented at 45 degrees relative to the second grating.

76. The system of claim 65, wherein a pitch of the first grating is equal to a pitch of the second grating times a magnification factor of the projection optical system.

77. The system of claim 65, wherein the detector receives a zeroth order diffraction image of an input numerical aperture of the projection optical system, and + and $-1^{st}$ order diffraction images of the input numerical aperture of the projection optical system.

78. The system of claim 65, wherein the second grating forms a shearing interferometer.

79. The system of claim 65, wherein a shear ratio of the system is approximately 1/30.

80. The system of claim 65, wherein an output numerical aperture of the projection optical system is approximately 0.25, and an input numerical aperture of the projection optical system is approximately 0.0625.

81. The system of claim 65, wherein a magnification of the projection optical system is approximately 4×.

82. The system of claim 65, wherein the reflecting dots have a random height distribution.

83. A system for EUV photolithography comprising:
   an EUV source emitting EUV radiation;
   an imaging system that illuminates an object plane with the EUV radiation;
   a reticle stage for mounting a reticle in an object plane;
   a first grating positioned on a reticle stage that conditions an illumination from the source at the object plane, the first grating including a plurality of reflecting lines each formed by a plurality of reflecting dots;
   a projection optical system that optically conjugates a focal plane and the object plane;
   a wafer stage;
   a second grating in the focal plane and positioned on the wafer stage; and
   a detector positioned on the wafer stage after the second grating that receives the image of the first grating through the second grating.

84. A method of measuring a wavefront of an optical system comprising:
   generating electromagnetic radiation at a source;
   focusing the electromagnetic radiation at an object plane of the optical system;
   positioning a first grating in an optical path of the optical system that conditions the electromagnetic radiation at the object plane, the first grating including a plurality of reflecting lines each formed by a plurality of reflecting dots;
   conjugating a focal plane and the object plane;
   positioning a detector below the focal plane and a second grating at the focal plane;
   receiving the image of the source through the second grating; and
   calculating wavefront parameters from the image.

85. The method of claim 84, wherein the reflecting dots are between 70 nm and 120 nm in diameter.

86. The method of claim 84, further including the step of phaseshifting a readout of the fringe pattern by stepping the first grating in a lateral direction and reading each frame with the detector.

87. The method of claim 84, wherein the electromagnetic radiation is approximately 13.5 nm.

88. The method of claim 84, wherein the reflecting dots are arranged in a random pattern within each line.

89. The method of claim 84, wherein the reflecting dots are arranged in a regular pattern within each line.

90. The method of claim 84, wherein the reflective dots create an illumination that overfills a numerical aperture of the projection optical system.

91. The method of claim 84, wherein the reflective dots create an illumination free of irregularities caused by the source.

92. The method of claim 84, wherein the plurality of reflecting lines of the first grating are arranged to maximize intensity and visibility of the fringe pattern.

93. The method of claim 84, wherein the plurality of lines are arranged in two orthogonal directions.

94. The method of claim 84, wherein the source is an Extreme Ultraviolet (EUV) radiation source.

95. The method of claim 84, wherein a pitch of the first grating is equal to a pitch of the second grating times a magnification factor of the projection optical system.

96. A wavefront measurement system comprising:
   a source of electromagnetic radiation;
   an imaging system that focuses the electromagnetic radiation at an object plane;
   a plurality of reflecting lines that receive the electromagnetic radiation and located in the object plane, each line formed by a plurality of reflecting dots;
   a projection optical system that projects an image of the reflecting lines onto a focal plane;
   a grating at the focal plane; and
   a detector that receives a fringe pattern produced by the grating.

97. The system of claim 96, wherein the reflecting dots are between 70 nm and 120 nm in diameter.

98. The system of claim 97, wherein the electromagnetic radiation is 13.5 nm.

99. The system of claim 96, wherein the reflecting dots are arranged in a random pattern within each line.

100. The system of claim 96, wherein the reflecting dots are arranged in a regular pattern within each line.

101. The system of claim 96, wherein the reflecting dots create an illumination that overfills a numerical aperture of the projection optical system.

102. The system of claim 96, wherein the reflecting dots create an illumination free of irregularities caused by the source.

103. The system of claim 96, wherein the plurality of reflecting lines are arranged to maximize intensity and visibility of the fringe pattern.

104. The system of claim 96, wherein the plurality of reflecting lines are arranged in two orthogonal directions.

105. The system of claim 104, wherein the plurality of reflecting lines are arranged as a checkerboard grating.

106. The system of claim 104, wherein the plurality of reflecting lines are arranged as two linear gratings.

107. The system of claim 96, wherein the source is an Extreme Ultraviolet (EUV) radiation source.

108. The system of claim 96, wherein the reflecting lines are positioned on a reticle stage.

109. The system of claim 96, wherein the grating is mounted on a wafer stage.

110. The system of claim 96, wherein the plurality of reflecting lines are oriented at 45 degrees relative to the grating.

111. The system of claim 96, wherein a pitch of the reflecting is equal to a pitch of the grating times a magnification factor of the projection optical system.

112. The system of claim 96, wherein the reflecting dots have a random height distribution.

* * * * *